(12) United States Patent
Tanimoto

(10) Patent No.: US 6,320,435 B1
(45) Date of Patent: Nov. 20, 2001

(54) PLL CIRCUIT WHICH CAN REDUCE PHASE OFFSET WITHOUT INCREASE IN OPERATION VOLTAGE

(75) Inventor: Susumu Tanimoto, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/688,967

(22) Filed: Oct. 17, 2000

(30) Foreign Application Priority Data

Oct. 19, 1999 (JP) .................................................. 11-296376

(51) Int. Cl.[7] .................................................. H03L 7/06
(52) U.S. Cl. .................................................. 327/156; 327/157
(58) Field of Search .................................. 327/156, 157, 327/162, 163, 148; 331/1 R, 25

(56) References Cited

U.S. PATENT DOCUMENTS

| | | | |
|---|---|---|---|
| 5,619,161 | * 4/1997 | Novof et al. | 327/157 |
| 5,740,213 | * 4/1998 | Dreyer | 327/157 |
| 5,986,485 | * 11/1999 | O'Sullivan | 327/156 |
| 6,065,140 | * 5/2000 | Irwin | 331/25 |
| 6,133,769 | * 10/2000 | Fontana et al. | 327/156 |

FOREIGN PATENT DOCUMENTS

8-84073   3/1996 (JP) .

OTHER PUBLICATIONS

I. Novo et al., "Fully Integrated CMOS Phase–Locked Loop with 15 to 240 MHz Locking Range and ±50 ps Jitter", IEEE Journal of Solid–State Circuits, vol. 30, No. 11, Nov. 1995.

* cited by examiner

*Primary Examiner*—Kenneth B. Wells
*Assistant Examiner*—Linh Nguyen
(74) *Attorney, Agent, or Firm*—McGuire Woods LLP

(57) ABSTRACT

A PLL circuit includes a comparator, an integrator, a phase controller, a current control oscillator and a feedback frequency divider. The comparator compares a phase of an input signal with a phase of a feedback signal to generate a comparison result. The integrator generates a first current to control an oscillation frequency of an output signal based on the comparison result. The phase controller controls a phase of the output signal based on the comparison result such that a phase difference between the phase of the input signal and the phase of the output signal at a lock state is reduced to generate a second current. The current control oscillator generates the output signal. The output signal oscillates at a frequency corresponding to a third current, wherein the first current and the second current add up to the third current. The feedback frequency divider performs a frequency division on the output signal to generate the feedback signal to send to the comparator.

20 Claims, 7 Drawing Sheets

Fig. 6
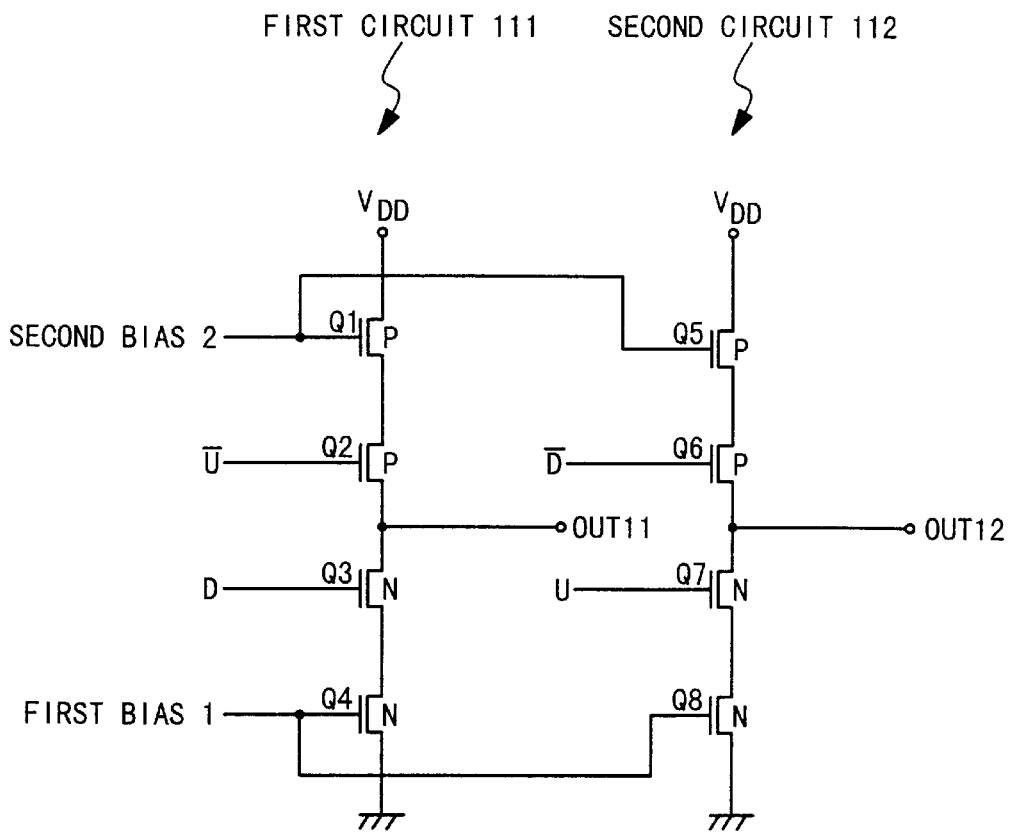
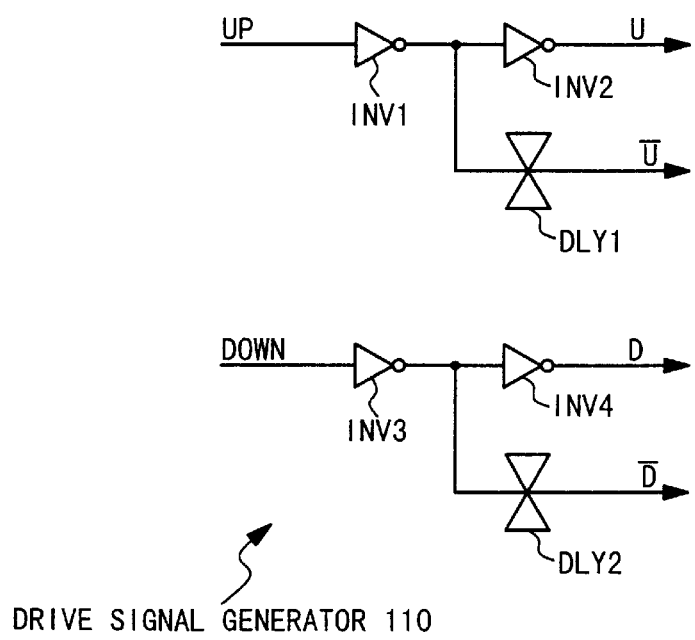
DRIVE SIGNAL GENERATOR 110

US 6,320,435 B1

PLL CIRCUIT WHICH CAN REDUCE PHASE OFFSET WITHOUT INCREASE IN OPERATION VOLTAGE

BACKGROUND OF THE INVENTION

1. Field of the Invention

The present invention relates to a PLL (Phase-Locked Loop) circuit. More particularly, the present invention relates to the PLL circuit for reducing a phase offset without an increase in an operation voltage.

2. Description of the Related Art

Conventionally, a PLL circuit has been known as one of basic techniques used in various fields, for example, such as information processing, communication and the like. This conventional PLL circuit, whose example is shown in FIG. 1, is provided with a phase frequency comparator 50, a charge pump 51, a loop filter 52, a voltage current converter 53, a current control oscillator 54 and a feedback frequency divider 55.

The phase frequency comparator 50 compares a phase and a frequency of an input signal $f_{REF}$ with those of a feedback signal $f_{FB}$ outputted from the feedback frequency divider 55, respectively, to generate one of an increase signal UP and a decrease signal DOWN which indicate errors between both the signals. For example, a clock signal from an oscillator (not shown) is used as the input signal $f_{REF}$ The increase signal UP generated by the phase frequency comparator 50 has a pulse width corresponding to a phase delay and a frequency drop of the feedback signal $f_{FB}$ with respect to the input signal $f_{REF}$. Also, the decrease signal DOWN has a pulse width corresponding to a phase advance or leading and a frequency rise or increase of the feedback signal $f_{FB}$ with respect to the input signal $f_{REF}$. The increase signal UP and the decrease signal DOWN which are generated by the phase frequency comparator 50 are sent to the charge pump 51.

The charge pump 51 is a charge pump of a single output. The charge pump 51 generates the current pulses corresponding to the respective pulse widths of the increase signal UP and the decrease signal DOWN to send to the loop filter 52. The loop filter 52 has a resistor $R_2$ and capacitors $C_4$, $C_5$. The loop filter 52 accumulates charges in the capacitors $C_4$, $C_5$, in response to the current pulses sent by the charge pump 51, and discharges the charges accumulated in the capacitors $C_4$, $C_5$, and then generates the voltages corresponding to the current pulses. The voltages generated by the loop filter 52 are sent to the voltage current converter 53.

The voltage current converter 53 converts the voltage outputted from the loop filter 52 into a current to send to the current control oscillator 54. The current control oscillator 54 generates a signal oscillating at a frequency corresponding to a value of the current sent by the voltage current converter 53. The current control oscillator 54 oscillates at a frequency equal to N times the frequency of the input signal $f_{REF}$ at a lock state. The signal generated by the current control oscillator 54 is outputted to external portion as an output signal $f_{OUT}$ of the PLL circuit, and sent to the feedback frequency divider 55. The feedback frequency divider 55 performs a frequency division into 1/N on the output signal $f_{OUT}$ to generate the feedback signal $f_{FB}$ and send the feedback signal $f_{FB}$ to the phase frequency comparator 50.

The operations of the conventional PLL circuit having the above-mentioned configuration will be described below. Let us suppose that a phase of the feedback signal $f_{FB}$ fed back to the phase frequency comparator 50 from the feedback frequency divider 55 is more delayed than a phase of the input signal $f_{REF}$.

In this case, the phase frequency comparator 50 generates the increase signal UP having the pulse width corresponding to the frequency drop and the phase delay to send to the charge pump 51. The charge pump 51 sends out a current corresponding to the increase signal UP, and charges the capacitors $C_4$, $C_5$ of the loop filter 52. Thus, the voltage generated by the loop filter 52 is made higher, which thereby increases the current outputted by the voltage current converter 53. This results in a rise of an oscillation frequency of the output signal $f_{OUT}$ outputted by the current control oscillator 54. Also, a phase of the output signal $f_{OUT}$ is advanced to thereby approach a phase of the input signal $f_{REF}$.

On the other hand, the case in which the phase of the feedback signal $F_{FB}$ is more advanced than a phase of the input signal $f_{REF}$ will be described below.

In this case, the phase frequency comparator 50 generates the decrease signal DOWN having the pulse width corresponding to the frequency rise and the phase advance to send to the charge pump 51. So, the charge pump 51 pulls the current corresponding to the decrease signal DOWN, and discharges the capacitors $C_4$, $C_5$ of the loop filter 52. Thus, the voltage outputted by the loop filter 52 is made lower, which thereby decreases the current outputted by the voltage current converter 53. This results in the drop in the oscillation frequency of the output signal $f_{OUT}$ outputted by the current control oscillator 54. Also, the phase of the output signal $f_{OUT}$ is delayed to thereby approach the phase of the input signal $f_{REF}$.

As mentioned above, the PLL circuit always compares the phase and the frequency of the output signal $f_{OUT}$ with those of the input signal $f_{REF}$, respectively. If there is the phase delay or the phase advance in the output signal $f_{OUT}$ with respect to the input signal $f_{REF}$, the feedback control is carried out so as to correct it. If the phase delay or the phase advance is converged within a predetermined range, the phase frequency comparator 50 generates the increase signal UP and the decrease signal DOWN having the same short pulse width. Thus, the amounts of the charges which are charged and discharged in the capacitors $C_4$, $C_5$ of the loop filter 52 are equal to each other and balanced so that the PLL circuit becomes at the lock state.

At this lock state, the phase and the frequency of the output signal $f_{OUT}$ coincide with those of the input signal $f_{REF}$, respectively. By the way, the charge pump 51 typically has a dead band, in which the charges are never charged and discharged unless there is a phase difference greater than a certain value, with regard to the relation between the phase difference, namely, the phase delay or the phase advance and the amount of the charge to be charged or discharged. Thus, it is designed such that the increase signal and the decrease signal having the same pulse width are generated even at the lock state.

The configuration example of another conventional PLL circuit will be described below with reference to FIG. 2.

A charge pump 61 used in this PLL circuit is a differential output pump. That is, the charge pump 61 generates a current pulse OUT1 corresponding to a pulse width of an increase signal UP and a current pulse OUT2 corresponding to a pulse width of a decrease signal DOWN, and sends to a first loop filter 62A and a second loop filter 62B, respectively. The configurations and the operations of the first loop filter 62A and the second loop filter 62B are equal to those of the above-mentioned loop filter 52. Then, a voltage current converter 53 converts a potential difference between a signal outputted from the first loop filter 62A and a signal outputted from the second loop filter 62B into a current signal.

According to this PLL circuit, the noise components of a power supply noise, a coupling noise to circuits except the loop filters and the like included in each of the first loop filter 62A and the second loop filter 62B are equal with each other, and the noise as a whole is cancelled out by the voltage current converter 53. That is, the above-mentioned noise has no influence on the potential difference between the first loop filter 62A and the second loop filter 62B, which leads to the merit of generating the PLL circuit strong in the noise.

By the way, in FIGS. 1 and 2, the capacitors $C_5$, $C_5$, are mounted so as to weaken a sharp change in a signal waveform caused by a pulse noise or a jitter. Values of capacitances of the capacitors $C_5$, $C_5$, are further smaller than those of the capacitors $C_4$, $C_4$, respectively.

The above-mentioned explanations are the examples of the typical PLL circuits. A PLL circuit in which the several defects in those conventional PLL circuits are removed is disclosed in Japanese Laid Open Patent Application (JP-A-Heisei, 8-84073) as a differential current control oscillator having a variable load. FIG. 3 shows the configuration of the main portion of this PLL circuit.

This PLL circuit receives an input signal $f_{REF}$ serving as a reference clock and a feedback signal $f_{FB}$ from a feedback frequency divider 55 to output a pair of an increase signal UP and a decrease signal DOWN. Also, differential output signals OUT1, OUT2 outputted from a first charge pump 71A are sent to capacitors $C_A$ $C_B$ of a loop filter 72, respectively, and sent through a voltage current converter 53 to a current control oscillator 54.

On the other hand, a current outputted by a second charge pump 71B is directly outputted to the current control oscillator 54. An oscillation frequency of the current control oscillator 54 is determined by the current from the voltage current converter 53 and the current from the second charge pump 71B. An output signal of the current control oscillator 54 is outputted to external portion as an output signal $f_{OUT}$ and also sent through the feedback frequency divider 55 to the phase frequency comparator 50 as a feedback signal $f_{FB}$.

This PLL circuit has two charge pumps, differently from the PLL circuits shown in FIGS. 1, 2.

When an output current of the charge pump 51 in FIG. 1 is assumed to be $I_P$, a signal processing in the loop filter 52 can be represented as $[I_P \cdot (R_2+1/(s \cdot C_4))] = I_P \cdot R_2 + I_P/(s \cdot C_4)]$ as an equation after a Laplace transform in an alternating current theory. A second term on a right side in this equation is an integration term for changing a frequency, and a first term on the right side is a linear term for instantly changing a phase.

On the contrary, in the PLL circuit of FIG. 3, the first charge pump 71A controls the frequency (integration term), and the second charge pump 71B controls the phase (linear term). By the way, as for the linear term, the second charge pump 71B may be designed such that when a gain of the voltage current converter 53 is assumed to be $[g_{vi}]$, a current value of $[I_P \cdot R_2 \cdot g_{vi}]$ is directly inputted to the current control oscillator 54.

As mentioned above, since the charge pump is divided into two sections, the resistor elements $R_2$, $R_2'$ are unnecessary which constitute the loop filter 52, 62A or 62B as shown in FIGS. 1, 2. As a result, since an area of a chip for forming a resistor is not required, this provides a merit of largely contributing to an improvement of an integration degree. Usually, a value of the resistor $R_2$ is in a range between 100 KΩ and 10 MΩ. The resistor occupies a region between 100 μm angle and 1 mm angle in the area of the chip. Thus, the fact that this resistor is not required can largely contribute to the improvement of the integration degree.

By the way, the charge pump 51 of the PLL circuit shown in FIG. 1 is constituted, for example, as shown in FIG. 4. In this charge pump 51, a P-channel MOS transistor Q10 is turned on in response to the increase signal UP. Thus, the charges are charged into the capacitance elements (capacitors $C_4$, $C_5$) of the loop filter 52 from a power supply $V_{DD}$. Also, an N-channel MOS transistor Q11 is turned on in response to the decrease signal DOWN. Hence, the charges accumulated in the capacitance elements of the loop filter 52 are discharged.

However, this conventional charge pump 51 has the following problem.

At the lock state, the pulse width of the increase signal UP is equal to that of the decrease signal DOWN. Thus, the amount of the charges charged into the capacitance elements of the loop filter 52 should be equal to the amount of the charges discharged from the capacitance elements. However, the problem lies in a fact that the amounts are different from each other because of the following two reasons.

The first reason is as follows.

That is, when the P-channel MOS transistor Q10 acting as a switch is turned on, a voltage applied between a source and a drain of a P-channel MOS transistor Q9 acting as a constant current source is changed depending on the voltage of the loop filter 52. Similarly, when the N-channel MOS transistor Q11 acting as a switch is turned on, a voltage applied between a source and a drain of an N-channel MOS transistor Q12 acting as a constant current source is changed depending on the voltage of the loop filter 52. In any case, the amount of the charges flowing into the loop filter 52 in a unit time, or the amount of the charges flowing out from the loop filter 52 in the unit time is changed depending on the voltage of the loop filter 52. Here, as for the amounts changed depending on the voltage of the loop filter 52 with regard to the amounts of the charges, the changed amount on the side of the P-channel MOS transistor Q9 connected to the power supply $V_{DD}$ is directionally opposite to the charged amount on the side of the N-channel MOS transistor Q12 connected to a ground. As a result, even if the increase signal UP and the decrease signal DOWN are the pulses having the same length, the amounts of the charges which are charged into and discharged from the capacitance elements of the loop filter 52 are different from each other.

The second reason is as follows.

That is, a factor on a manufacturing process and the like cause respective parasitic capacitances generated in the P-channel MOS transistor and the N-channel MOS transistor to be different from each other. As a result, the amounts of the charges when the charges are charged into or discharged from the parasitic capacitances are changed depending on the output voltage of the loop filter 52, namely, the oscillation frequency. Moreover, they are never cancelled out.

This results in a situation that the capacitance elements of the loop filter 52 is charged, for example, at a substantially excessive state. The occurrence of this situation causes the oscillation frequency to be higher, and also makes the phase of the output signal $f_{OUT}$ more advanced than that of the input signal $f_{REF}$. So, the adjustment is done such that the pulse width of the decrease signal DOWN is made longer, and the amount of the charges discharged from the capacitance elements of the loop filter 52 becomes zero. And, it is balanced at this state. Thus, although the frequency of the input signal $f_{REF}$ is synchronous with that of the output signal $F_{OUT}$, a so-called phase offset is induced in which the phase of the output signal $F_{OUT}$ is still advanced with respect to that of the input signal $f_{REF}$ and it becomes at the lock state.

A problem corresponding to the first reason can be solved by using a circuit technique of a cascade connection used in a PLL circuit disclosed in Japanese Laid Open Patent Application (JP-A-Heisei, 8-84073). However, the usage of the cascade connection brings about a problem that a high operation voltage must be supplied. So, a PLL circuit is desirable which does not use the cascade connection.

Also, another problem corresponding to the second reason can be solved by configuring a switching circuit with a differential circuit, such as the PLL circuit disclosed in Japanese Laid Open Patent Application (JP-A-Heisei, 8-84073). However, the configuration achieves a certain measure of the solution and it is insufficient.

The following technique is disclosed in a paper by Ilya I. Novof, John Austin, Ram Kelkar, Don Strayer, and Steve Wyatt with a title of "Fully Integrated CMOS Phase-Locked Loop with 15 to 240 MHz Locking Range and ± ps Jitter" in the IEEE JOURNAL OF SOLID-STATE CIRCUITS, VOL. 30, No. 11, NOVEMBER 1995, pp 1259~1266. That is to say, a fully integrated phase-locked loop (PLL) in a digital 0.5 μm CMOS technology is described. The PLL has a locking range of 15 to 240 MHz. The static phase error is less than ±100 ps with a peak-to-peak jitter of ±50 ps at a 100 MHz output frequency. The PLL has a resistorless architecture achieved by the implementation of feedforward current injection into the current controlled oscillator.

The following technique is disclosed in U.S. Pat. No. 5,619,161 (US005619161A) by Novof et al. That is to say, a phase locked loop circuit includes a phase/frequency detector which uses a divider circuit and feedback from a clock distribution tree to generate INC and DEC pulses which have no "dead zone". A pair of charge pumps receives the INC and DEC pulses. One charge pump is a differential pump and has voltage controlled common mode feedback circuit to maintain a common mode controlled voltage. A differential current is outputted to a loop filter capacitor by this charge pump. The other charge pump is a single-ended output pump which supplies current to a current controlled oscillator which also receives input from a voltage to current converter. The current controlled oscillator includes a variable resistance load which varies inversely with the magnitude of the input current. A jitter control circuit is provided which reduces jitter in the current controlled oscillator output in the locked phase. Also, a lock indicator is provided which is time independent, and provides a lock indication when the loop enters the locked condition.

SUMMARY OF THE INVENTION

The present invention is accomplished in view of the above mentioned problems. Therefore, an object of the present invention is to provide a PLL circuit that can protect a phase offset from occurring. Another object of the present invention is to provide a PLL circuit that can reduce an operation voltage to a low voltage.

In order to achieve an aspect of the present invention, a PLL circuit, includes: a comparator comparing a phase of an input signal with a phase of a feedback signal to generate a comparison result; an integrator generating a first current to control an oscillation frequency of an output signal based on the comparison result; a phase controller controlling a phase of the output signal based on the comparison result such that a phase difference between the phase of the input signal and the phase of the output signal at a lock state is reduced to generate a second current; a current control oscillator generating the output signal, the output signal oscillating at a frequency corresponding to a third current, wherein the first current and the second current add up to the third current; and a feedback frequency divider performing a frequency division on the output signal to generate the feedback signal to send to the comparator.

In this case, the phase controller protects a phase offset.

Also in this case, the comparator compares a frequency of the input signal with a frequency of the feedback signal in addition to the comparing the phase of the input signal with the phase of the feedback signal, to generate the comparison result.

Further in this case, the integrator includes a first charge pump, a first loop filter and a first voltage current converter, and wherein the first charge pump has a single output section, the single output section outputting a single current corresponding to the comparison result, and wherein the first loop filter has a first capacitor connected to the single output section and wherein the first voltage current converter converts a voltage generated by the first loop filter into the first current.

In this case, the integrator includes a specific first charge pump, a specific first loop filter and a specific first voltage current converter, and wherein the specific first charge pump has specific first and second output sections, the s specific first and second output sections outputting specific currents corresponding to the comparison result, respectively, and wherein the specific first loop filter has a specific first capacitor connected to the specific first output section and a specific second capacitor connected to the specific second output section and wherein the specific first voltage current converter converts a specific voltage generated by the specific first loop filter into the first current.

Also in this case, the integrator further includes a specific first common-mode voltage controller maintaining a specific first potential inputted to the specific first voltage current converter within a specific first predetermined range.

Further in this case, a PLL circuit further includes: a clock tree synthesis buffer section inputting the output signal from the current control oscillator to output to the feedback frequency divider.

In this case, the phase controller includes a differential charge pump having first and second output sections, the first and second output sections outputting currents corresponding to the comparison result, respectively and being connected to each other through a resistor.

Also in this case, a value of the resistor is 1 KΩ.

Further in this case, the phase controller includes a voltage current converter converting a potential difference across the resistor into the second current.

In this case, the phase controller includes a loop filter having the resistor and a first capacitor connected to the first output section and a second capacitor connected to the second output section.

Also in this case, the first and second capacitors protect a sharp voltage variation caused by a pulse noise, respectively.

Further in this case, the phase controller includes a common-mode voltage controller maintains a potential inputted to the voltage current converter within a predetermined range.

In this case, a voltage of a predetermined value is supplied to a middle point of the resistor such that a potential inputted to the voltage current converter is maintained within a predetermined range.

Also in this case, the phase controller includes a specific loop filter having the resistor and a third capacitor connected with the first and second output sections.

Further in this case, a voltage of a predetermined value is supplied to a middle point of the resistor.

In this case, the differential charge pump includes first and second circuits, and wherein the first circuit includes a first constant current source and a first P channel MOS transistor and a first N channel MOS transistor in series, a first connecting point between the first P channel MOS transistor and the first N channel MOS transistor corresponding to the first output section, and wherein the second circuit includes a second constant current source and a second P channel MOS transistor and a second N channel MOS transistor in series, a second connecting point between the second P channel MOS transistor and the second N channel MOS transistor corresponding to the second output section.

Also in this case, the differential charge pump is constituted without using a circuit technique of a cascade connection.

Further in this case, the first and second output sections are connected to each other through a wiring instead of the resistor.

In this case, the differential charge pump has a dead band in which a charge is never charged or discharged unless there is a specific phase difference greater than a set value between the phase of the input signal with the phase of the feedback signal.

According to a PLL circuit of the present invention, a phase controller generates a current pulse only for a short time in accordance with a comparison result from a phase frequency comparator to control a phase of an output signal. Accordingly, a phase offset, which is a phase difference between an input signal and an output signal that is induced at a lock state, can be reduced to thereby protect the phase offset from occurring.

According to this configuration, the circuit technique of the cascade connection described in the column of the conventional technique becomes unnecessary to thereby provide a merit that the PLL circuit can be operated at a low voltage.

BRIEF DESCRIPTION OF THE DRAWINGS

FIG. 6 is a circuit diagram showing a configuration of first and second charge pumps in FIG. 5.

DESCRIPTION OF THE PREFERRED EMBODIMENTS

An embodiment of the present invention will be described below with reference to the attached drawings.

Figure 5:
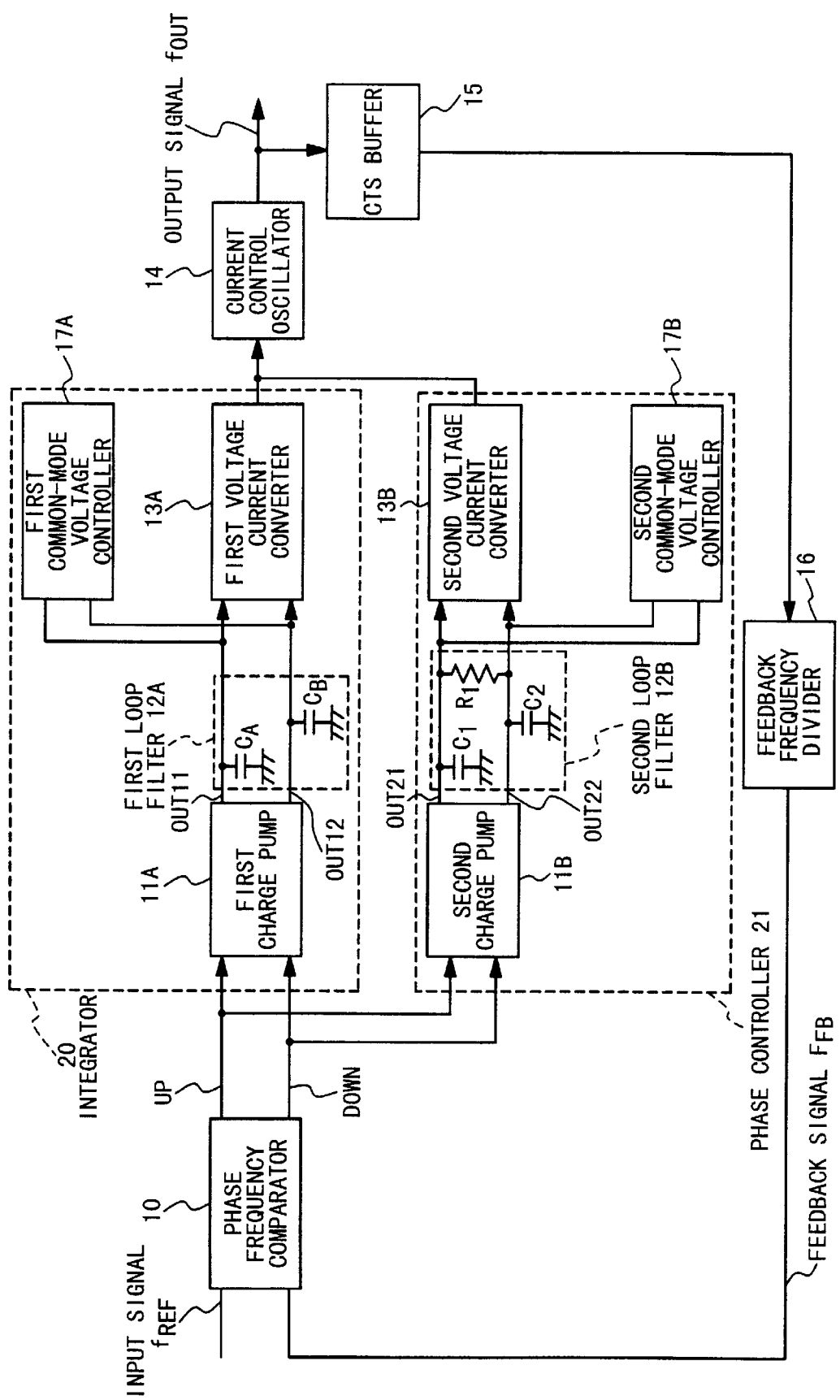
FIG. 5 is a block diagram showing a configuration of a PLL circuit according to an embodiment of the present invention.

FIG. 5 is a block diagram showing the configuration of a PLL circuit according to the embodiment of the present invention. This PLL circuit is provided with a phase frequency comparator 10, an integrator 20, a phase controller 21, a current control oscillator 14, a CTS buffer 15 and a feedback frequency divider 16.

The phase frequency comparator 10 compares a phase and a frequency of an input signal $f_{REF}$ with those of a feedback signal $f_{FB}$ from the feedback frequency divider 16, respectively, to generate an increase signal UP and a decrease signal DOWN which indicate errors of both the signals. For example, a clock signal from an oscillator (not shown) is used as the input signal $f_{REF}$. The increase signal UP generated by the phase frequency comparator 10 has a pulse width corresponding to a phase delay of the feedback signal $f_{FB}$ with respect to the input signal $f_{REF}$. Also, the decrease signal DOWN has a pulse width corresponding to a phase advance of the feedback signal $f_{FB}$ with respect to the input signal $f_{REF}$. The increase signal UP and the decrease signal DOWN which are generated by the phase frequency comparator 10 are sent to the integrator 20 and the phase controller 21.

The integrator 20 is composed of a first charge pump 11A, a first loop filter 12A, a first voltage current converter 13A and a first common-mode voltage controller 17A. The first charge pump 11A is a charge pump of a differential output. For example, as shown in FIG. 6, the first charge pump 11A is composed of a drive signal generator 110, a first circuit 111 and a second circuit 112.

As shown in FIG. 6, the drive signal generator 110 generates signals ]U (hereafter, "]" implies an inversion), D to drive the first circuit 111 and, signals ]D , U to drive the second circuit 112. This drive signal generator 110 is composed of inverters INV1 to INV4 and delay circuits DLY1 and DLY2. The respective inverters INV1 to INV4 have the same electric characteristics, and the delay circuits DLY1 and DLY2 have the same delay characteristics as the inverters INV1 to INV4.

The increase signal UP from the phase frequency comparator 10 is inverted by the inverter INV1, and sent to the inverter INV2 and the delay circuit DLY1. The inverter INV2 inverts the signal from the inverter INV1, and sends as the signal U to the second circuit 112. The delay circuit DLY1 delays the signal from the inverter INV1, and sends as the signal ]U to the first circuit 111. Thus, a change timing of the signal ]U coincides with a change timing of the signal U.

Similarly, the decrease signal DOWN from the phase frequency comparator 10 is inverted by the inverter INV3, and sent to the inverter INV4 and the delay circuit DLY2. The inverter INV4 inverts the signal from the inverter INV3, and sends as the signal D to the first circuit 111. The delay circuit DLY2 delays the signal from the inverter INV3, and sends as the signal ]D to the second circuit 112. Thus, a change timing of the signal ]D coincides with a change timing of the signal D.

The first circuit 111 is constituted by transistors Q1 to Q4 connected in series. The transistors Q1, Q2 are composed of P-channel MOS transistors, and the transistors Q3, Q4 are composed of N-channel MOS transistors. A drain of the transistor Q1 is connected to a power supply $V_{DD}$, and a source thereof is connected to a drain of the transistor Q2. A second bias 2 from a voltage source (not shown) is sent to a gate of the transistor Q1. So, the transistor Q1 acts as a constant current source. A source of the transistor Q2 is connected to a drain of the transistor Q3. The signal ]U is sent to a gate of the transistor Q2 from the drive signal generator 110. This transistor Q2 acts as a switch which is turned on or off in response to the signal ]U.

A source of the transistor Q3 is connected to a drain of the transistor Q4. The signal D is sent to a gate of the transistor Q3 from the drive signal generator 110. This transistor Q3 acts as a switch which is turned on or off in response to the signal D. A source of the transistor Q4 is grounded. A first bias 1 is sent to a gate of the transistor Q4 from a voltage source (not shown). So, the transistor Q4 acts as a constant current source. A first output terminal OUT11 is pulled out from a connection point between the transistors Q2, Q3.

Similarly, the second circuit 112 is constituted by transistors Q5 to Q8 connected in series. The transistors Q5, Q6 are composed of P-channel MOS transistors, and the transistors Q7, Q8 are composed of N-channel MOS transistors. A drain of the transistor Q5 is connected to the power supply $V_{DD}$, and a source thereof is connected to a drain of the transistor Q6. The second bias 2 from the voltage source (not shown) is sent to a gate of the transistor Q5. So, the transistor Q5 acts as a constant current source. A source of the transistor Q6 is connected to a drain of the transistor Q7. The signal ]D is sent to a gate of the transistor Q6 from the drive signal generator 110. This transistor Q6 acts as a switch which is turned on or off in response to the signal ]D.

A source of the transistor Q7 is connected to a drain of the transistor Q8. The signal U is sent to a gate of the transistor Q7 from the drive signal generator 110. This transistor Q7 acts as a switch which is turned on or off in response to the signal U. A source of the transistor Q8 is grounded. The first bias 1 is sent to a gate of the transistor Q8 from the voltage source (not shown). So, the transistor Q8 acts as a constant current source. A second output terminal OUT12 is pulled out from a connection point between the transistors Q6, Q7. By the way, all values of currents flowing through the transistors Q1, Q4, Q5 and Q8 acting as the constant current sources are equal to each other.

The first output terminal OUT11 of the first charge pump 11A is connected through the first loop filter 12A to an input terminal of each of the first voltage current converter 13A and the first common-mode voltage controller 17A. Also, the second output terminal OUT12 is connected through the first loop filter 12A to the other input terminal of each of the first voltage current converter 13A and the first common-mode voltage controller 17A.

The first loop filter 12A is composed of capacitors $C_A$, $C_B$. One terminal of the capacitor $C_A$ is connected to the first output terminal OUT11 of the first charge pump 11A, and the other terminal is grounded. Also, one terminal of the capacitor $C_B$ is connected to the second output terminal OUT12, and the other terminal is grounded. Outputs of the first loop filter 12A (a potential of the first output terminal OUT11 and a potential of the second output terminal OUT12) are sent to the first voltage current converter 13A and the first common-mode voltage controller 17A. By the way, the first loop filter 12A may be configured such that a capacitor is mounted between the first output terminal OUT11 and the second output terminal OUT12 of the first charge pump 11A.

The first voltage current converter 13A is the well known circuit for converting the difference between the potential of the first output terminal OUT11 and the potential of the second output terminal OUT12 outputted by the first loop filter 12A, into an electrical signal, and then sending to the current control oscillator 14. The first common-mode voltage controller 17A is used in order to maintain the potentials inputted to the first voltage current converter 13A, within a predetermined range. This first common-mode voltage controller 17A is the well known circuit used to determine an average voltage of outputs. A current signal outputted by the first voltage current converter 13A is sent to the current control oscillator 14.

The phase controller 21 is composed of a second charge pump 11B, a second loop filter 12B, a second voltage current Converter 13B and a second common-mode voltage controller 17B. The configuration of the second charge pump 11B is equal to that of the first charge pump 11A.

A first output terminal OUT21 of the second charge pump 11B is connected through a second loop filter 12B to one input terminal of each of the second voltage current converter 13B and the second common-mode voltage controller 17B. Also, a second output terminal OUT22 is connected through the second loop filter 12B to the other input terminal of each of the second voltage current converter 13B and the second common-mode voltage controller 17B.

The second loop filter 12B is composed of capacitors $C_1$, $C_2$, and a resistor $R_1$. One terminal of the capacitor $C_1$ is connected to the first output terminal OUT21 of the second charge pump 11B, and the ther terminal is grounded. Also, one terminal of the capacitor $C_2$ is connected to the second output terminal OUT22, and the other terminal is grounded. Moreover, the resistor $R_1$ is connected between the first output terminal OUT21 and the second output terminal OUT22. A value of the resistor $R_1$ may be set at, for example, about 1 KΩ. The resistor of the above-mentioned value only occupies a region of about 10 μm angle in an area of a chip. Thus, the drop of the integration degree does not bring about a severe problem.

Outputs of the second loop filter 12B (a potential of the first output terminal OUT21 and a potential of the second output terminal OUT22) is sent to the second voltage current converter 13B and the second common-mode voltage controller 17B.

Figure 7:
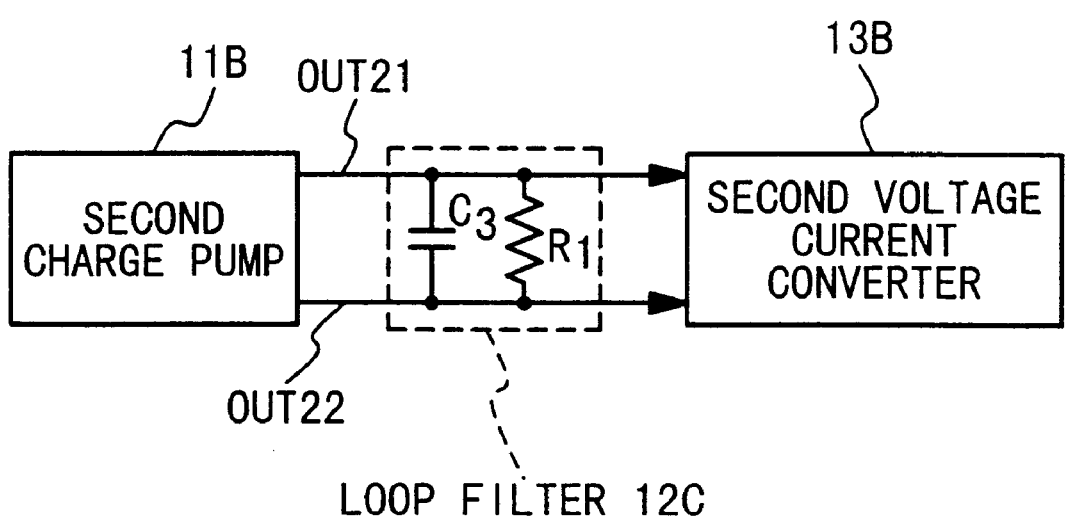
FIG. 7 is a circuit diagram showing a variation of the second loop filter in FIG. 5.

By the way, a loop filter 12C having the configuration shown in FIG. 7 may be used instead of the second loop filter 12B. This loop filter 12C is composed of a resistor $R_1$ and a capacitor $C_3$ which are respectively connected between the first output terminal OUT21 and the second output terminal OUT22 of the second charge pump 11B. Even the usage of the loop filter 12C can provide the effect and the action similar to those of the second loop filter 12B.

The capacitors $C_1$, $C_2$ in the second loop filter 12B of FIG. 5 are provided to protect a sharp voltage variation caused by a pulse noise. If the pulse noise is sufficiently small, those capacitors $C_1$, $C_2$ can be omitted.

The configuration of the second voltage current converter 13B is equal to that of the first voltage current converter 13A, and the configuration of the second common-mode voltage controller 17B is equal to that of the first common-mode voltage controller 17A. An output line of the second voltage current converter 13B is coupled to an output line of the first voltage current converter 13A. Accordingly, a current outputted by the second voltage current converter 13B and a current outputted by the first voltage current converter 13A are added to each other, to be sent as a synthesis current to the current control oscillator 14.

The second common-mode voltage controller 17B in the phase controller 21 may be substituted by the configuration that a predetermined voltage source is sent to, for example, a middle point of the resistor $R_1$. In this case, the voltage source can be configured such that a resistor division is performed on the power supply voltage $V_{DD}$ to accordingly generate a voltage of $V_{DD}/2$. This configuration does not require the second common-mode voltage controller 17B. Thus, this has a merit that the circuit becomes simple.

The current control oscillator 14 generates a signal oscillating at a frequency corresponding to a current value of the synthesis current. The current control oscillator 14 oscillates at a frequency equal to N times the frequency of the input signal $f_{REF}$ at a lock state. The signal generated by the current control oscillator 14 is outputted to external portion as an output signal $f_{OUT}$ of the PLL circuit, and also sent to the CTS buffer 15.

The CTS (Clock Tree Synthesis) buffer 15 is composed of a plurality of buffer circuits for receiving the output signal $f_{OUT}$ from the current control oscillator 14. An output of each of the buffer circuits is sent as a clock signal to each section of an electric circuit includes the PLL circuit. Thus, a skew between a plurality of clock signals is corrected.

A clock signal from one of the buffer circuits in the CTS buffer 15 is sent to the feedback frequency divider 16. The feedback frequency divider 16 divides the output signal $f_{OUT}$ into 1/N, and sends to the phase frequency comparator 10.

The operations of the PLL circuit having the above-mentioned configuration according to the embodiment of the present invention will be described below. At first, let us consider a case in which a phase of a feedback signal $f_{FB}$ fed from the feedback frequency divider 16 back to the phase frequency comparator 10 is more delayed than that of the input signal $f_{REF}$.

In this case, the phase frequency comparator 10 generates the increase signal UP having the pulse width corresponding to the phase delay, and sends to the first charge pump 11A of the integrator 20 and the second charge pump 11B of the phase controller 21.

At first, the operation of the integrator 20 is as follows. That is, the drive signal generator 110 of the first charge pump 11A generates the signal ]U and the signal U in response to the increase signal UP. When the generated signal ]U is sent to the transistor Q2, the transistor Q2 is turned on, which causes a current to flow out from the first output terminal OUT11. Then, the charges of the current are charged into the capacitor $C_A$. As a result, a potential corresponding to a pulse width of the signal ]U appears at the first output terminal OUT11.

At the same time, when the signal U generated by the drive signal generator 110 is sent to the transistor Q7, the transistor Q7 is turned on, which causes a current to pull from the second output terminal OUT12. Then, the charges accumulated in the capacitor $C_B$ are discharged. As a result, a potential corresponding to a pulse width of the signal U appears at the second output terminal OUT12. The potential at the first output terminal OUT11 and the potential at the second output terminal OUT12 are sent to the first voltage current converter 13A and the first common-mode voltage controller 17A.

The first voltage current converter 13A converts the potential difference of the potentials from the first loop filter 12A into a current signal, and sends to the current control oscillator 14. In this case, the potential difference is positive (which hereafter implies that the potential at the first output terminal OUT11 is higher than the potential at the second output terminal OUT12). Thus, the current outputted by the first voltage current converter 13A is increased, which increases an oscillation frequency of the output signal $f_{OUT}$ outputted by the current control oscillator 14.

The operation of the phase controller 21 is as follows. That is, the second charge pump 11B, when the increase signal UP is sent by the phase frequency comparator 10, acts similarly to the first charge pump 11A. Then, the second charge pump 11B makes a current flow out from the first output terminal OUT21, and also makes a current pull from the second output terminal OUT22. Accordingly, the charges are charged into the capacitor $C_1$. So, a potential corresponding to a pulse width of the signal ]U appears at the first output terminal OUT21. At the same time, the charges accumulated in the capacitor $C_2$ are discharged. Then, a potential corresponding to a pulse width of the signal U appears at the second output terminal OUT22.

Here, the potentials appearing at the first output terminal OUT21 and the second output terminal OUT22 become equal to each other after an elapse of a period defined by a time constant determined by the capacitors $C_1$, $C_2$ and the resistor $R_1$, since the first output terminal OUT21 and the second output terminal OUT22 are connected to each other through the resistor $R_1$. The potential at the first output terminal OUT21 and the potential at the second output terminal OUT22 are sent to the second voltage current converter 13B and the second common-mode voltage controller 17B.

The second voltage current converter 13B converts the difference between the potential at the first output terminal OUT21 and the potential at the second output terminal OUT22 outputted by the second loop filter 12B, into a current signal, and sends to the current control oscillator 14. In this case, the potential difference between the potentials is positive to thereby increase the current outputted by the second voltage current converter 13B only for a short time. Thus, the oscillation frequency of the output signal $f_{OUT}$ outputted by the current control oscillator 14 is made higher only for the short time. Hence, the phase of the output signal $f_{OUT}$ is advanced to accordingly approach the phase of the input signal $f_{REF}$. The output signal $f_{OUT}$ from the current control oscillator 14 is sent through the CTS buffer 15 to the feedback frequency divider 16. Then, after divided by the feedback frequency divider 16, it is fed back to the phase frequency comparator 10 as the feedback signal $f_{FB}$. Next, let us consider a case in which the phase of the feedback signal $f_{FB}$ fed from the feedback frequency divider 16 back to the phase frequency comparator 10 is more advanced than that of the input signal $f_{REF}$.

In this case, the phase frequency comparator 10 generates a decrease signal DOWN having a pulse width corresponding to a phase advance, and sends to the first charge pump 11A of the integrator 20 and the second charge pump 11B of the phase controller 21.

At first, the operation of the integrator 20 is as follows. That is, the drive signal generator 110 of the first charge pump 11A generates the signal D and the signal ]U in response to the decrease signal DOWN. When the generated signal D is sent to the transistor Q3, the transistor Q3 is turned on, which causes a current to pull from the first output terminal OUT11. Then, the charges accumulated in the capacitor $C_A$ are discharged. As a result, a potential corresponding to a pulse width of the signal D appears at the first output terminal OUT11.

At the same time, when the signal ]D generated by the drive signal generator 110 is sent to the transistor Q6, the transistor Q6 is turned on, which causes a current to flow out from the second output terminal OUT12. Then, the charges of the current are charged into the capacitor $C_B$. As a result, a potential corresponding to a pulse width of the signal D appears at the second output terminal OUT12. The potential at the first output terminal OUT11 and the potential at the second output terminal OUT12 are sent to the first voltage current converter 13A and the first common-mode voltage controller 17A.

The first voltage current converter 13A converts the potential difference between the potential at the first output terminal OUT11 and the potential at the second output terminal OUT12 outputted by the first loop filter 12A, into a current signal, and sends to the current control oscillator 14. In this case, the potential difference is negative (which hereafter implies that the potential at the first output terminal OUT11 is lower than the potential at the second output terminal OUT12). Thus, the current outputted by the first voltage current converter 13A is decreased, which decreases the oscillation frequency of the output signal $f_{OUT}$ outputted by the current control oscillator 14.

The operation of the phase controller 21 is as follows. That is, the second charge pump 11B, when the decrease signal DOWN is sent by the phase frequency comparator 10, acts similarly to the first charge pump 11A. Then, the second charge pump 11B makes a current pull from the first output terminal OUT21, and also makes a current flow out from the second output terminal OUT22. Accordingly, the charges accumulated in the capacitor $C_1$ are discharged. So, a potential corresponding to the pulse width of the signal D appears at the first output terminal OUT21. At the same time, the charges are charged into the capacitor $C_2$. Then, a potential corresponding the pulse width of the signal ]D appears at the second output terminal OUT22.

Here, the potentials appearing at the first output terminal OUT21 and the second output terminal OUT22 become equal to each other after the elapse of the period defined by the time constant determined by the capacitors $C_1$, $C_2$ and the resistor $R_1$, since the first output terminal OUT21 and the second output terminal OUT22 are connected to each other through the resistor $R_1$. The potential at the first output terminal OUT21 and the potential at the second output terminal OUT22 are sent to the second voltage current converter 13B and the second common-mode voltage controller 17B.

The second voltage current converter 13B converts the potential difference between the potential at the first output terminal OUT21 and the potential at the second output terminal OUT22 outputted by the second loop filter 12B, into a current signal, and sends to the current control oscillator 14. In this case, the potential difference between the potentials is negative to thereby decrease the current outputted by the second voltage current converter 13B only for a short time. Thus, the oscillation frequency of the output signal $f_{OUT}$ outputted by the current control oscillator 14 is made lower only for the short time. And, the phase of the output signal $f_{OUT}$ is delayed to accordingly approach the phase of the input signal $f_{REF}$. The output signal $f_{OUT}$ from the current control oscillator 14 is sent through the CTS buffer 15 to the feedback frequency divider 16, similarly to the above-mentioned case. Then, after divided by the feedback frequency divider 16, it is fed back to the phase frequency comparator 10 as the feedback signal $f_{FB}$.

As mentioned above, according to the PLL circuit of the embodiment of the present invention, in the phase controller 21, the small current pulse is always outputted to thereby adjust the phase. Thus, it is possible to obtain the output signal $f_{OUT}$ having no phase offset. Also, the charge pump in this PLL circuit does not use the circuit technique referred to as the cascade connection, for example, as shown in FIG. 7. Hence, it can be operated at a low voltage.

Figure 1:
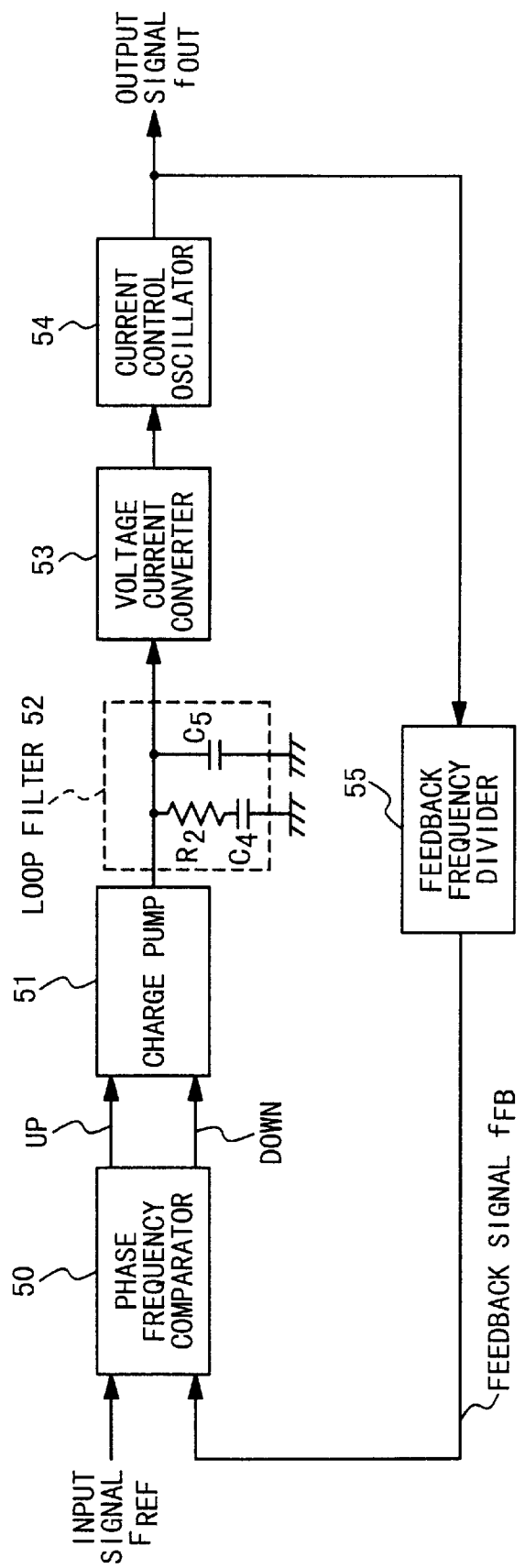
FIG. 1 is a block diagram showing a configuration example of a conventional PLL circuit.
Figure 2:
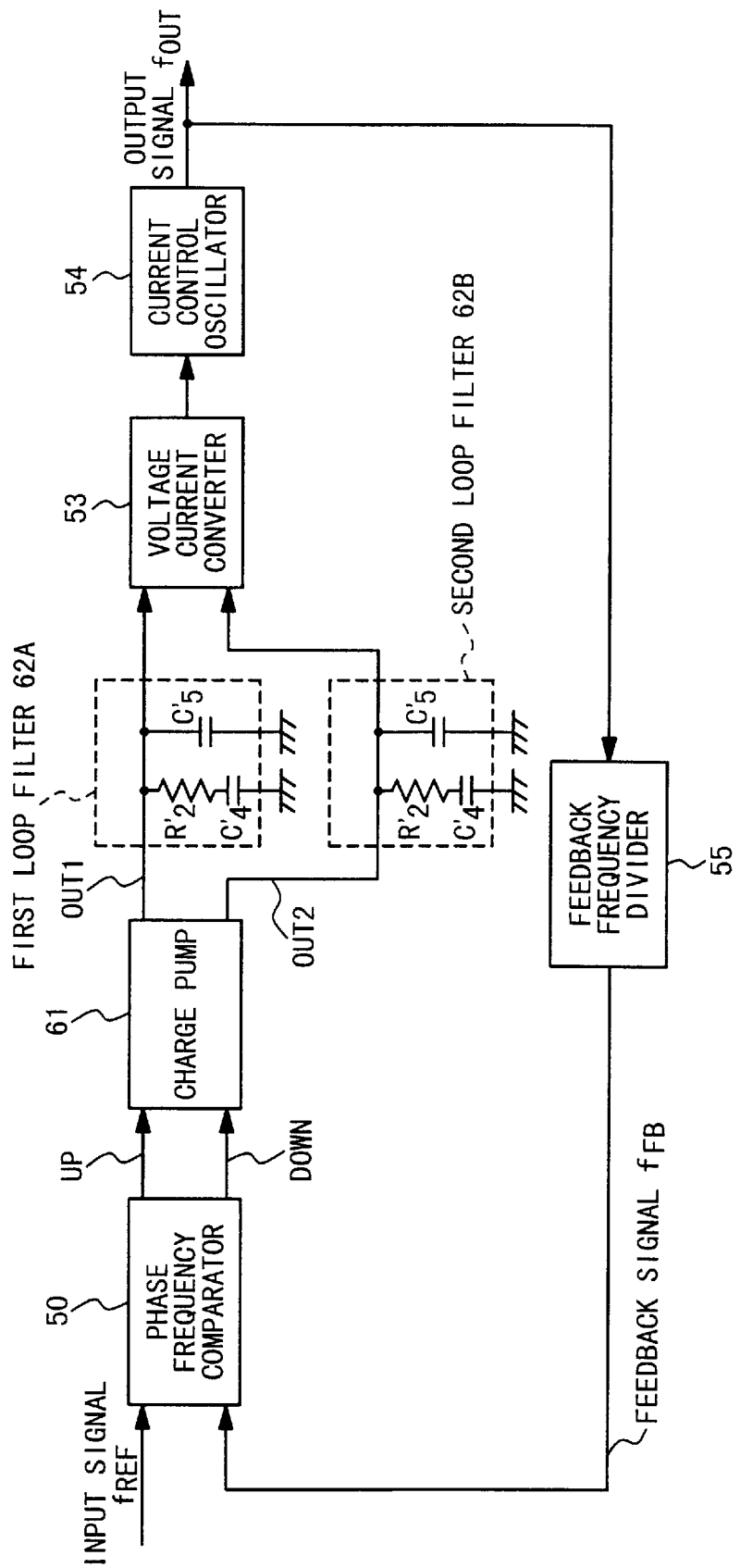
FIG. 2 is a block diagram showing a configuration example of a conventional another PLL circuit.
Figure 3:
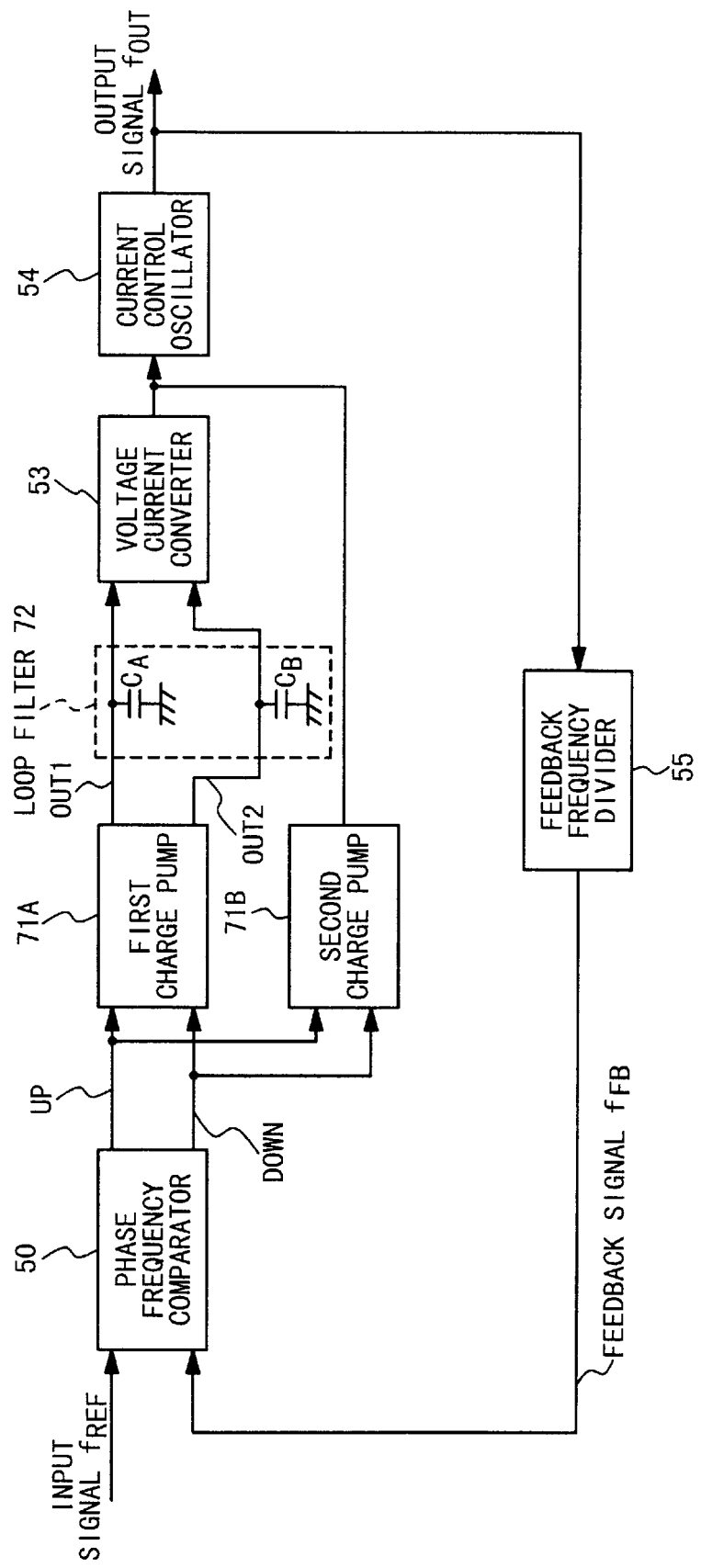
FIG. 3 is a block diagram showing a configuration example of a conventional still another PLL circuit.
Figure 4:
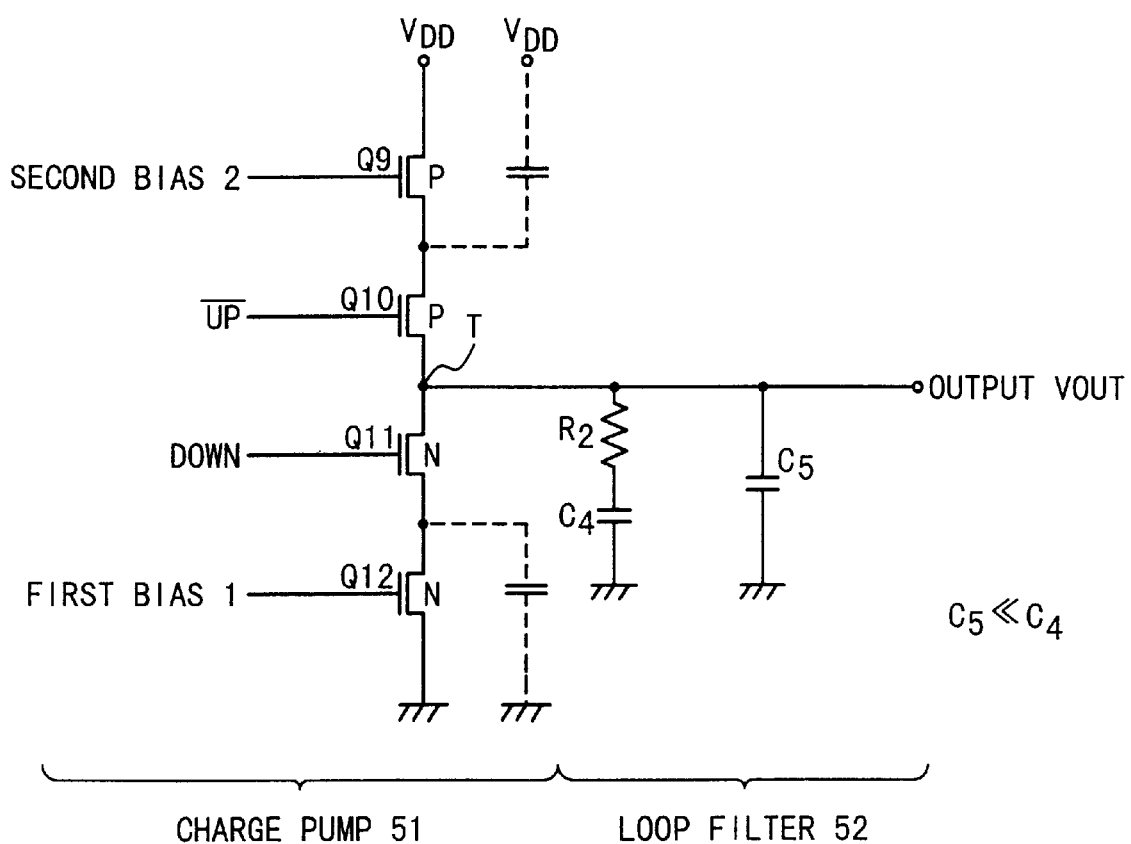
FIG. 4 is a circuit diagram showing a detailed configuration of a charge pump and a loop filter in the conventional PLL circuit.

By the way, in the above-mentioned embodiment, the charge pump of the differential output is used as the integrator 20. However, the charge pump of the single output may be used as shown in FIG. 1. Even this case can provide the effect and the action similar to those of the case in which the charge pump of the differential output is used.

Also, in the above-mentioned embodiment, the PLL circuit is described which has the phase frequency comparator for comparing the phase and the frequency. However, the above-mentioned phase controller can be applied in its original state to even a PLL circuit having a phase comparator for comparing only the phase. Even this case can provide the effect and the action similar to those of the above-mentioned embodiment.

As mentioned above, according to the present invention, it is possible to provide the PLL circuit, which can protect the phase offset from occurring and also reduce the operation voltage to the low voltage.

What is claimed is:

1. A PLL circuit, comprising:
   a comparator comparing a phase of an input signal with a phase of a feedback signal to generate a comparison result;
   an integrator generating a first current to control an oscillation frequency of an output signal based on said comparison result;
   a phase controller controlling a phase of said output signal based on said comparison result such that a phase difference between said phase of said input signal and said phase of said output signal at a lock state is reduced to generate a second current;
   a current control oscillator generating said output signal, said output signal oscillating at a frequency corresponding to a third current, wherein said first current and said second current add up to said third current; and
   a feedback frequency divider performing a frequency division on said output signal to generate said feedback signal to send to said comparator.

2. A PLL circuit according to claim 1, wherein said phase controller protects a phase offset.

3. A PLL circuit according to claim 1, wherein said comparator compares a frequency of said input signal with a frequency of said feedback signal in addition to said comparing said phase of said input signal with said phase of said feedback signal, to generate said comparison result.

4. A PLL circuit according to claim 1, wherein said integrator includes a first charge pump, a first loop filter and a first voltage current converter, and
   wherein said first charge pump has a single output section, said single output section outputting a single current corresponding to said comparison result, and
   wherein said first loop filter has a first capacitor connected to said single output section and
   wherein said first voltage current converter converts a voltage generated by said first loop filter into said first current.

5. A PLL circuit according to claim 1, wherein said integrator includes a specific first charge pump, a specific first loop filter and a specific first voltage current converter, and
   wherein said specific first charge pump has specific first and second output sections, said s specific first and second output sections outputting specific currents corresponding to said comparison result, respectively, and
   wherein said specific first loop filter has a specific first capacitor connected to said specific first output section and a specific second capacitor connected to said specific second output section and wherein said specific first voltage current converter converts a specific voltage generated by said specific first loop filter into said first current.

6. A PLL circuit according to claim 5, wherein said integrator further includes a specific first common-mode voltage controller maintaining a specific first potential inputted to said specific first voltage current converter within a specific first predetermined range.

7. A PLL circuit according to claim 1, further comprising:
a clock tree synthesis buffer section inputting said output signal from said current control oscillator to output to said feedback frequency divider.

8. A PLL circuit according to claim 1, wherein said phase controller includes a differential charge pump having first and second output sections, said first and second output sections outputting currents corresponding to said comparison result, respectively and being connected to each other through a resistor.

9. A PLL circuit according to claim 8, wherein a value of said resistor is 1 KΩ.

10. A PLL circuit according to claim 8, wherein said phase controller includes a voltage current converter converting a potential difference across said resistor into said second current.

11. A PLL circuit according to claim 8, wherein said phase controller includes a loop filter having said resistor and a first capacitor connected to said first output section and a second capacitor connected to said second output section.

12. A PLL circuit according to claim 11, wherein said first and second capacitors protect a sharp voltage variation caused by a pulse noise, respectively.

13. A PLL circuit according to claim 10, wherein said phase controller includes a common-mode voltage controller maintains a potential inputted to said voltage current converter within a predetermined range.

14. A PLL circuit according to claim 10, wherein a voltage of a predetermined value is supplied to a middle point of said resistor such that a potential inputted to said voltage current converter is maintained within a predetermined range.

15. A PLL circuit according to claim 8, wherein said phase controller includes a specific loop filter having said resistor and a third capacitor connected with said first and second output sections.

16. A PLL circuit according to claim 8, wherein a voltage of a predetermined value is supplied to a middle point of said resistor.

17. A PLL circuit according to claim 8, wherein said differential charge pump includes first and second circuits, and
wherein said first circuit includes a first constant current source and a first P channel MOS transistor and a first N channel MOS transistor in series, a first connecting point between said first P channel MOS transistor and said first N channel MOS transistor corresponding to said first output section, and
wherein said second circuit includes a second constant current source and a second P channel MOS transistor and a second N channel MOS transistor in series, a second connecting point between said second P channel MOS transistor and said second N channel MOS transistor corresponding to said second output section.

18. A PLL circuit according to claim 8, wherein said differential charge pump is constituted without using a circuit technique of a cascade connection.

19. A PLL circuit according to claim 8, wherein said first and second output sections are connected to each other through a wiring instead of said resistor.

20. A PLL circuit according to claim 8, wherein said differential charge pump has a dead band in which a charge is never charged or discharged unless there is a specific phase difference greater than a set value between said phase of said input signal with said phase of said feedback signal.

* * * * *